(12) United States Patent
Jang et al.

(10) Patent No.: US 9,831,298 B2
(45) Date of Patent: Nov. 28, 2017

(54) ORGANIC LIGHT-EMITTING DEVICE

(71) Applicant: LG DISPLAY CO., LTD., Seoul (KR)

(72) Inventors: Junhyuk Jang, Daejeon (KR); Yeon Keun Lee, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/125,895

(22) PCT Filed: Mar. 13, 2015

(86) PCT No.: PCT/KR2015/002468
§ 371 (c)(1),
(2) Date: Sep. 13, 2016

(87) PCT Pub. No.: WO2015/137771
PCT Pub. Date: Sep. 17, 2015

(65) Prior Publication Data
US 2017/0117350 A1  Apr. 27, 2017

(30) Foreign Application Priority Data

Mar. 14, 2014  (KR) .................. 10-2014-0030456

(51) Int. Cl.
| H01L 29/08 | (2006.01) |
| H01L 27/32 | (2006.01) |
| H01L 51/52 | (2006.01) |
| H01L 51/00 | (2006.01) |
| H01L 51/56 | (2006.01) |

(52) U.S. Cl.
CPC ...... *H01L 27/3279* (2013.01); *H01L 51/0097* (2013.01); *H01L 51/5212* (2013.01); *H01L 51/5268* (2013.01); *H01L 51/56* (2013.01); H01L 2251/5338 (2013.01)

(58) Field of Classification Search
CPC ......... H01L 27/32; H01L 51/00; H01L 51/52; H01L 51/56; H01L 51/5212; H01L 51/50; H01L 51/0097
USPC ........................................................ 257/40
See application file for complete search history.

(56) References Cited

U.S. PATENT DOCUMENTS

| 2005/0135027 A1 | 6/2005 | Suh |
| 2005/0225234 A1 | 10/2005 | Tyan et al. |
| 2009/0220680 A1 | 9/2009 | Winters |
| 2011/0273491 A1 | 11/2011 | Iida et al. |
| 2012/0153831 A1 | 6/2012 | Kasai |
| 2012/0181933 A1 | 7/2012 | Ma et al. |
| 2013/0078883 A1 | 3/2013 | Hiraoka |
| 2013/0187186 A1 | 7/2013 | Popp |

FOREIGN PATENT DOCUMENTS

| CN | 102548078 A | 7/2012 |
| DE | 102008013031 A1 | 9/2009 |
| JP | 2001-338770 A | 12/2001 |
| KR | 10-2010-0118134 A | 11/2010 |
| TW | 201031263 A1 | 8/2010 |
| WO | 01/56000 A2 | 8/2001 |
| WO | 2011/117574 A1 | 9/2011 |

*Primary Examiner* — Long K Tran
(74) *Attorney, Agent, or Firm* — Dentons US LLP

(57) ABSTRACT

The present specification relates to an organic light emitting device.

34 Claims, 4 Drawing Sheets

[Figure 1]
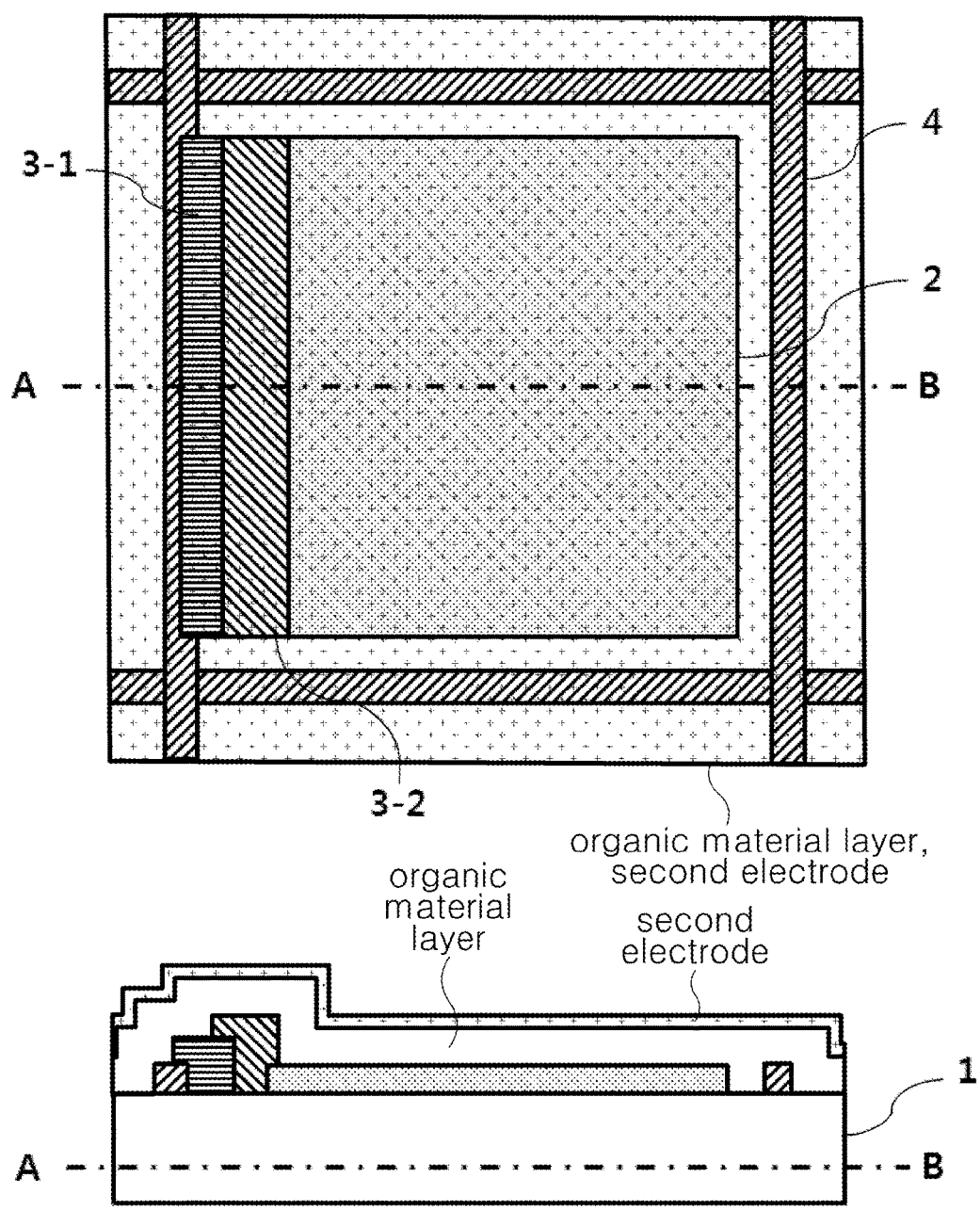

[Figure 2]
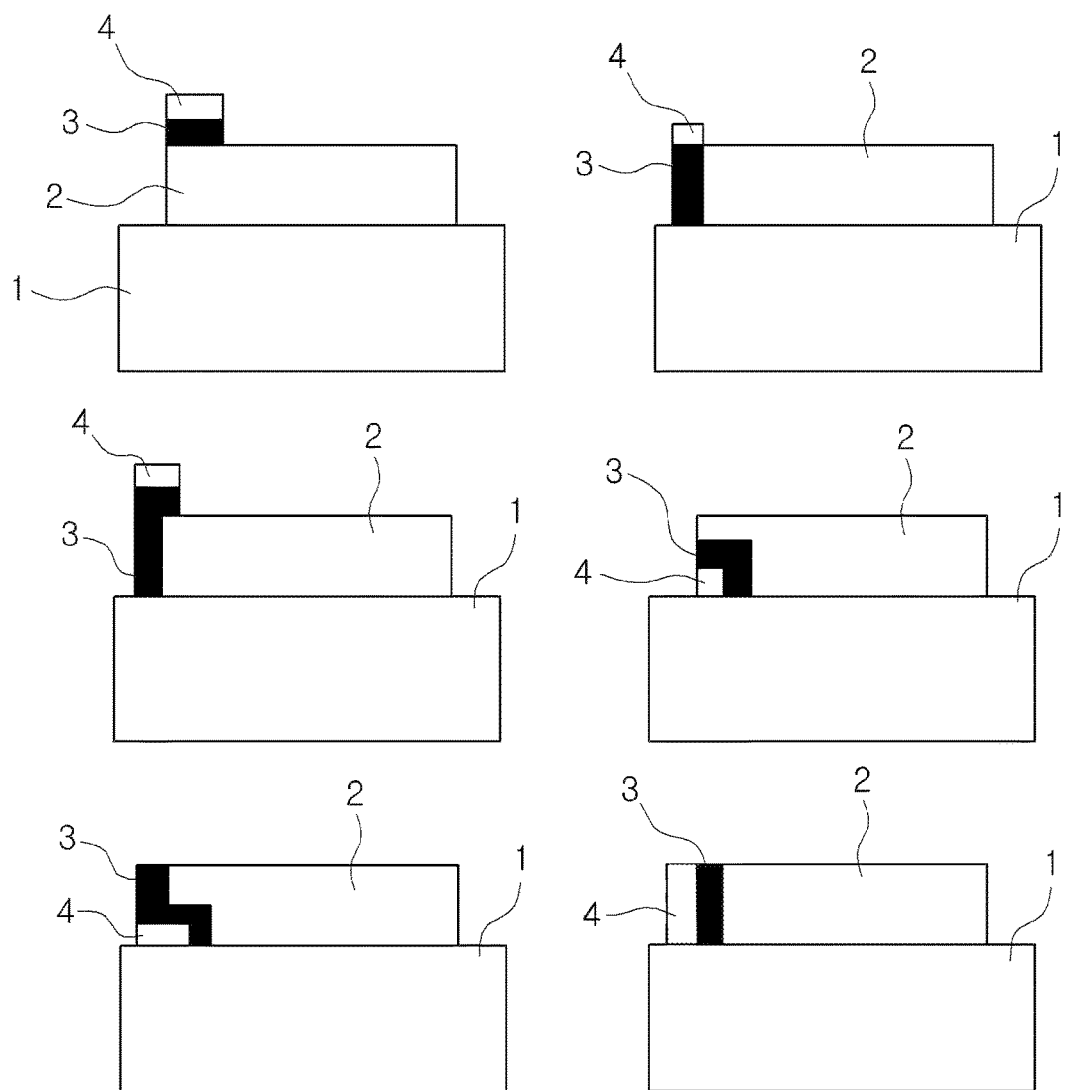

[Figure 3]
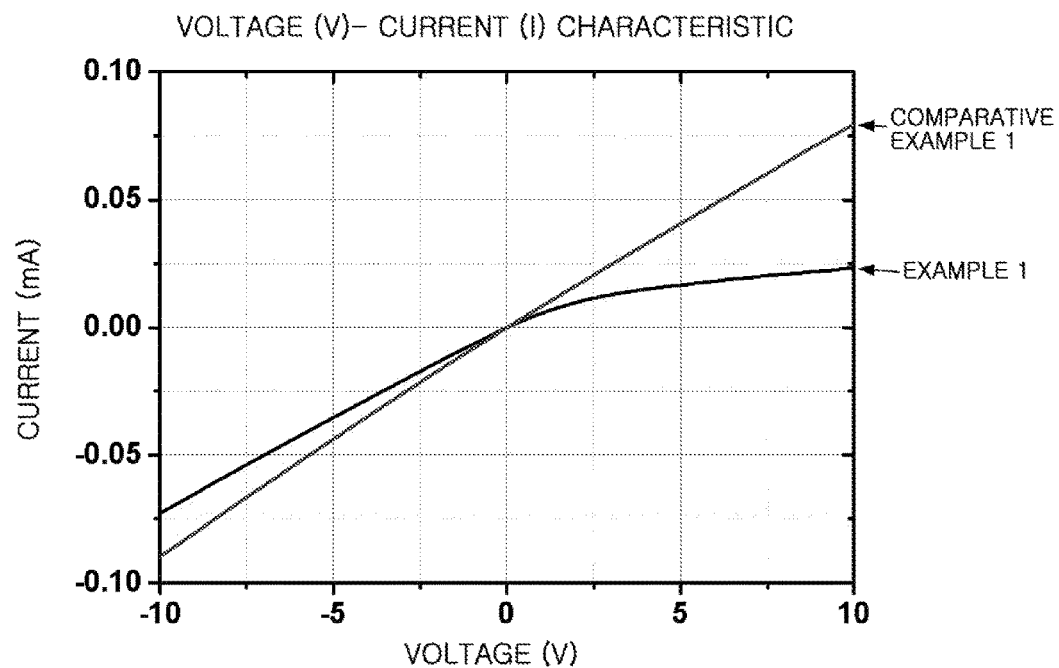

[Figure 4]
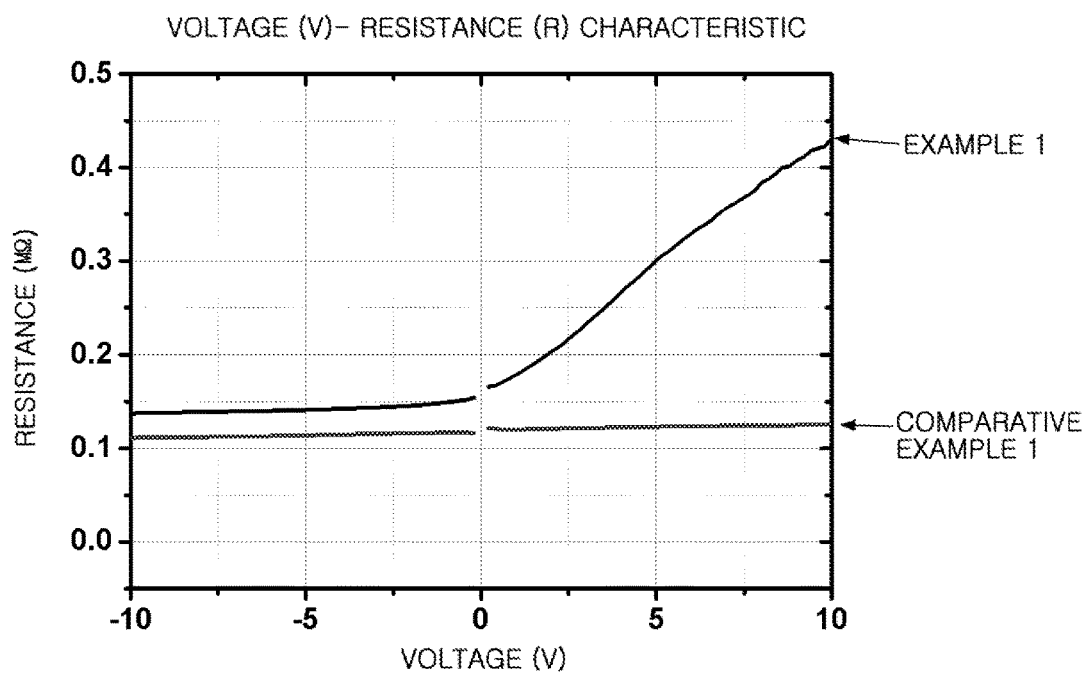

ORGANIC LIGHT-EMITTING DEVICE

This is application is a National Stage Entry of International Application No. PCT/KR2015/002468 filed Mar. 13, 2015, which claims priority to Korean Patent Application No. 10-2014-0030456 filed Mar. 14, 2014, which is incorporated by reference for all purposes as if fully set forth herein.

TECHNICAL FIELD

The present specification claims priority to Korean Patent Application No. 10-2014-0030456, filed in the Korean Intellectual Property Office on Mar. 14, 2014, the entire contents of which are incorporated herein by reference.

The present specification relates to an organic light emitting device.

BACKGROUND ART

An organic light emitting phenomenon refers to a phenomenon of converting electrical energy to light energy using an organic material. That is, when an appropriate organic layer is positioned between an anode and a cathode, and voltage is applied between two electrodes, holes are injected into the organic layer from the anode and electrons are injected into the organic layer from the cathode. Excitons are generated when the injected holes and electrons encounter, and light is generated when the excitons fall down to a ground state again.

Since an interval between the anode and the cathode is small, an organic light emitting device (OLED) is easy to have a short-circuit defect. Particularly, the anode and the cathode are in direct contact with each other by a pin hole, a crack, a step and coating roughness in a structure of an organic light emitting device, and the like, so that a short-circuit defect may be generated, and a thickness of an organic material layer in a region, in which a short-circuit defect is expected, is gradually decreased, so that a short-circuit defect may be generated. A defect zone provides a low resistance path in which a current flows, so as to enable a current to minimally flow in a light emission region of the organic light emitting device or never flow in an extreme case. Accordingly, light emission output of the organic light emitting device decreases or disappears. In a multi-pixel display device, the short-circuit defect may generate a dead pixel which does not emit light or emits light less than an average light intensity, thereby degrading a display quality. In the case of lighting or other low resolution usages, a considerable portion of a corresponding zone may not operate due to the short-circuit defect. Due to the concerns of the short-circuit defect, the organic light emitting device is generally manufactured in a clean room. However, even though the environment is clean, the clean environment may not effectively remove the short-circuit defect. In many cases, in order to decrease the number of short-circuit defects by increasing the interval between two electrodes, the thickness of an organic layer may be unnecessarily increased as compared to a thickness actually required to operate the organic light emitting device. This method may cause additional cost in manufacturing the organic light emitting device, and further, the method cannot completely remove the short-circuit defect.

RELATED ART LITERATURE

Patent Document

Korean Patent Application Laid-Open No. 10-2006-0130729 (Published on Dec. 19, 2006)

DETAILED DESCRIPTION OF THE INVENTION

Technical Problem

The present inventors has been made in an effort to provide an organic light emitting device capable of operating in a normal range even when a short-circuit defect is generated due to a factor capable of causing a short-circuit defect, and a method for manufacturing the same.

Technical Solution

An exemplary embodiment of the present specification provides an organic light emitting device, including: a first electrode; a second electrode provided so as to be opposite to the first electrode; one or more organic material layers provided between the first electrode and the second electrode; an auxiliary electrode of the first electrode; and a short-circuit preventing layer provided between the first electrode and the auxiliary electrode, in which the first electrode and the auxiliary electrode are provided so as to be spaced apart from each other, the short-circuit preventing layer is in contact with at least a part of the first electrode and at least a part of the auxiliary electrode, and resistance of the short-circuit preventing layer when a forward directional voltage is applied is larger than resistance of the short-circuit preventing layer when a reverse directional voltage is applied.

Another exemplary embodiment of the present specification provides an organic light emitting device, including: a first electrode; a second electrode provided so as to be opposite to the first electrode; one or more organic material layers provided between the first electrode and the second electrode; an auxiliary electrode of the first electrode; and a short-circuit preventing layer provided between the first electrode and the auxiliary electrode, in which the first electrode and the auxiliary electrode are provided while being spaced apart from each other, the short-circuit preventing layer is in contact with at least a part of the first electrode and at least a part of the auxiliary electrode, and any one of a difference in an energy level of the short-circuit preventing layer and the first electrode at an interface of the short-circuit preventing layer and the first electrode and a difference in an energy level of the short-circuit preventing layer and the auxiliary electrode at an interface of the short-circuit preventing layer and the auxiliary electrode is 0.5 eV or more, and the other is 0.5 eV or less.

Yet another exemplary embodiment of the present specification provides a display device including the organic light emitting device.

Still another exemplary embodiment of the present specification provides a lighting device including the organic light emitting device.

Advantageous Effects

The organic light emitting device according to the exemplary embodiments of the present specification may normally maintain a function of the organic light emitting device even when a short-circuit defect is generated. Particularly, the organic light emitting device according to the exemplary embodiments of the present specification may prevent the entire device from operation failure by controlling the amount of leakage current even though a short-circuit defect is generated.

Further, the organic light emitting device according to the exemplary embodiments of the present specification may stably operate without increasing the large amount of leakage current even though a size of a short-circuit generation region is increased.

Further, the organic light emitting device according to the exemplary embodiments of the present specification includes the short-circuit preventing layer having asymmetric resistance, so that it is possible to advantageously prevent a leakage current due to a short-circuit defect by the short-preventing layer having high resistance when a forward directional voltage is applied for driving the organic light emitting device, and perform a post-treatment process by the short-preventing layer having low resistance when a reverse directional voltage is applied for the post-treatment process of the organic light emitting device.

BRIEF DESCRIPTION OF DRAWINGS

FIG. 1 is a plan view and a cross-sectional view of one conductive unit in an organic light emitting device according to an exemplary embodiment of the present specification.

FIG. 2 exemplifies a cross-section of a state where a first electrode, a short-circuit preventing layer, and an auxiliary electrode according to an exemplary embodiment of the present specification are provided.

FIG. 3 is a graph illustrating current values when forward directional and reverse directional voltages are applied in a short-circuit preventing layer of Example 1 and Comparative Example 1 of the present specification.

FIG. 4 is a graph illustrating resistance values when forward directional and reverse directional voltages are applied in the short-circuit preventing layer of Example 1 and Comparative Example 1 of the present specification.

BEST MODE

Hereinafter, the present specification will be described in more detail.

An exemplary embodiment of the present specification provides an organic light emitting device, including: a first electrode; a second electrode provided so as to be opposite to the first electrode; one or more organic material layers provided between the first electrode and the second electrode; an auxiliary electrode of the first electrode; and a short-circuit preventing layer provided between the first electrode and the auxiliary electrode, in which the first electrode and the auxiliary electrode are provided while being spaced apart from each other, the short-circuit preventing layer is in contact with at least a part of the first electrode and at least a part of the auxiliary electrode, and resistance of the short-circuit preventing layer when a forward directional voltage is applied is larger than that when a reverse directional voltage is applied.

According to the exemplary embodiment of the present specification, the resistance of the short-circuit preventing layer may mean resistance from the auxiliary electrode, which is in contact with the short-circuit preventing layer, to the first electrode, which is in contact with the short-circuit preventing layer. Particularly, the resistance of the short-circuit preventing layer when the forward directional voltage is applied may be resistance between the auxiliary electrode and the first electrode when the forward directional voltage is applied. Further, the resistance of the short-circuit preventing layer when the reverse directional voltage is applied may be resistance between the auxiliary electrode and the first electrode when the reverse directional voltage is applied.

An exemplary embodiment of the present specification provides an organic light emitting device, including: a first electrode; a second electrode provided so as to be opposite to the first electrode; one or more organic material layers provided between the first electrode and the second electrode; an auxiliary electrode of the first electrode; and a short-circuit preventing layer provided between the first electrode and the auxiliary electrode, in which the first electrode and the auxiliary electrode are provided while being spaced apart from each other, the short-circuit preventing layer is in contact with at least a part of the first electrode and at least a part of the auxiliary electrode, and any one of a difference in an energy level of the short-circuit preventing layer and the first electrode at an interface of the short-circuit preventing layer and the first electrode and a difference in an energy level of the short-circuit preventing layer and the auxiliary electrode at an interface of the short-circuit preventing layer and the auxiliary electrode is 0.5 eV or more, and the other is 0.5 eV or less.

A work function level, a conduction band level, a valence band level, a highest occupied molecular orbital (HOMO) level, and a lowest unoccupied molecular orbital (LUMO) level, and the like may be commonly used as the energy level.

Particularly, when a target material of the energy level is a metal, the energy level may be a work function level. Further, when a target material of the energy level is an inorganic material or an inorganic semiconductor, the energy level may be a conduction band level or a valence band level. Further, when a target material of the energy level is an organic material or an organic semiconductor, the energy level may be an HOMO level or a LUMO level.

According to the exemplary embodiment of the present specification, the short-circuit preventing layer may electrically connect the first electrode and the auxiliary electrode.

When a short-circuit defect is generated in a partial region of an organic light emitting device, the short-circuit preventing layer makes a current flow to the short-circuit defect region to serve to prevent the organic light emitting device from operation failure.

The short-circuit defect may be generated when the second electrode is in direct contact with the first electrode. Otherwise, the short-circuit defect may also be generated when the second electrode is in contact with the first electrode because a function of the organic material layer is lost by a thickness decrease or deformation of the organic material layer positioned between the first electrode and the second electrode. When the short-circuit defect is generated, a current of the organic light emitting device flows to a short-circuit defect region having low resistance, so that the organic light emitting device cannot be normally operated. The current of the organic light emitting device may avoid a defect-free section and flow by a leakage current, in which a current directly flows from the first electrode to the second electrode, by the short-circuit defect. This may decrease light emission output of the organic light emitting device, and the organic light emitting device may not be operated in many cases. Further, when a current distributed and flowing in the organic material having a wide area is concentrated and flows to a short-circuit generating point, high heat is locally generated, so that there is a risk in which the device incurs an explosion or fire is generated.

However, the short-circuit preventing layer according to the exemplary embodiment of the present specification may be located between the auxiliary electrode and the first electrode before a short-circuit defect is generated to serve as a current flow path, and to minimize an increase in an operation voltage of the device. Further, when a short-circuit defect is generated, the short-circuit preventing layer makes only the small amount of current leak to a short-circuit generating point, thereby preventing efficiency of the organic light emitting device from deteriorating and making the device normally operate.

That is, the short-circuit preventing layer serves to prevent a current from leaking through a short-circuit defect region by adding appropriate resistance to a flow path of a current flowing to the short-circuit defect region when a short-circuit defect is generated.

Further, the short-circuit preventing layer may serve to improve efficiency of an aging process. Particularly, the aging process may mean a post-treatment process of the organic light emitting device.

The aging process is one of the aging processes of the organic light emitting device, and may mean a process enabling a pixel, which is processed to have a defect, of the organic light emitting device to be used by electrically blocking a short-circuit region, that is, short-circuited anode and cathode, generated at a part of a manufacturing process of the organic light emitting device. Further, when the aging process is performed, a region, in which a short-circuit may be generated during driving of the organic light emitting device, may be electrically blocked in advance, thereby decreasing a defect rate of a commercialized organic light emitting device. That is, the aging process is used, it is possible to improve stability and reliability of the organic light emitting device.

A reverse directional voltage may be applied during the aging process. When a reverse directional voltage is applied to the organic light emitting device, a voltage drop is incurred by a level proportional to a size of resistance, and the short-circuit preventing layer may make a current smoothly flow in a reverse direction with a low resistance value, thereby improving efficiency of the aging process.

When resistance of the short-circuit preventing layer when a forward directional voltage is applied is the same as resistance when a reverse directional voltage is applied, there is a problem in that an effect of a post-treatment process is decreased by the short-circuit preventing layer when the reverse directional voltage is applied for the post-treatment process. Accordingly, the organic light emitting device according to the exemplary embodiment of the present specification includes the short-circuit preventing layer having asymmetric resistance, so that it is possible to advantageously prevent a leakage current due to a short-circuit defect by the short-preventing layer having high resistance when a forward directional voltage is applied for driving the organic light emitting device, and perform a post-treatment process by the short-preventing layer having low resistance when a reverse directional voltage is applied for the post-treatment process of the organic light emitting device.

The "application of a forward directional voltage" may mean that a current flows in a direction from the anode to the cathode of the organic light emitting device so that the organic light emitting device may emit light.

The "application of a reverse directional voltage" may mean that a current flows in a direction from the cathode to the anode of the organic light emitting device for the aging process of the organic light emitting device.

According to the exemplary embodiment of the present specification, the short-circuit preventing layer may have larger resistance during the application of a forward directional voltage by two times or more than the resistance during the application of a reverse directional voltage. Further, according to the exemplary embodiment of the present specification, the short-circuit preventing layer may have larger resistance during the application of a forward directional voltage by five times or more than the resistance during the application of a reverse directional voltage. Particularly, according to the exemplary embodiment of the present specification, the short-circuit preventing layer may have larger resistance during the application of a forward directional voltage by 10 times or more than resistance during the application of a reverse directional voltage.

According to the exemplary embodiment of the present specification, the resistance of the short-circuit preventing layer during the application of the forward directional voltage may be 300Ω or more and 3 MΩ or less.

Further, according to the exemplary embodiment of the present specification, the resistance of the short-circuit preventing layer during the application of the reverse directional voltage may be 60Ω or more and 1.5 MΩ or less.

In the organic light emitting device according to the exemplary embodiment of the present specification, the resistance of the short-circuit preventing layer during the application of the forward directional voltage may be 300Ω or more and 3 MΩ or less, and the resistance of the short-circuit preventing layer during the application of the reverse directional voltage may be 150Ω or more and 1.5 MΩ or less.

Further, in the organic light emitting device according to the exemplary embodiment of the present specification, the resistance of the short-circuit preventing layer during the application of the forward directional voltage may be 300Ω or more and 3 MΩ or less, and the resistance of the short-circuit preventing layer during the application of the reverse directional voltage may be 60Ω or more and 600 MΩ or less.

When the short-circuit preventing layer is within the resistance range, the organic light emitting device may control the amount of current flowing to a short-circuit defection region when a short-circuit defect is generated, thereby enabling the organic light emitting device to normally operate and securing high efficiency during the aging process.

According to the exemplary embodiment of the present specification, a resistance value of a region of the short-circuit preventing layer, which is in contact with the first electrode, may be different from a resistance value of a region of the short-circuit preventing layer, which is in contact with the auxiliary electrode. Particularly, a difference between the resistance value of the region of the short-circuit preventing layer, which is in contact with the first electrode, and the resistance value of the region of the short-circuit preventing layer, which is in contact with the auxiliary electrode may be 300Ω or more and 3 MΩ or less.

According to the exemplary embodiment of the present specification, the resistance value of the region of the short-circuit preventing layer, which is in contact with the first electrode, may be gradually increased or decreased to the resistance value of the region of the short-circuit preventing layer, which is in contact with the auxiliary electrode.

According to the exemplary embodiment of the present specification, the resistance value of the region of the short-circuit preventing layer, which is in contact with the first electrode, may be larger than the resistance value of the region of the short-circuit preventing layer, which is in contact with the auxiliary electrode. In this case, the first electrode may be the anode.

According to the exemplary embodiment of the present specification, the resistance value of the region of the short-circuit preventing layer, which is in contact with the first electrode, may be smaller than the resistance value of the region of the short-circuit preventing layer, which is in contact with the auxiliary electrode. In this case, the first electrode may be the cathode.

The region of the short-circuit preventing layer, which is in contact with the first electrode, means a region of the short-circuit preventing layer closer to the first electrode than the auxiliary electrode. Further, the region of the short-circuit preventing layer, which is in contact with the auxiliary electrode, means a region of the short-circuit preventing layer closer to the auxiliary electrode than the first electrode.

According to the exemplary embodiment of the present specification, the resistance value of the short-circuit preventing layer during the application of the forward directional voltage may be a resistance value at a threshold voltage of the organic light emitting device. The threshold resistance may mean a minimum voltage applied so as to enable the organic light emitting device to emit light. Further, according to the exemplary embodiment of the present specification, the resistance value of the short-circuit preventing layer during the application of the reverse directional voltage may be a resistance value at a voltage which has the same absolute value as that of the threshold voltage of the organic light emitting device and has a negative value.

According to the exemplary embodiment of the present specification, the resistance value of the short-circuit preventing layer during the application of the forward directional voltage may be a resistance value at a voltage of 5 V. According to the exemplary embodiment of the present specification, the resistance value of the short-circuit preventing layer during the application of the reverse directional voltage may be a resistance value at a voltage of −5 V.

According to the exemplary embodiment of the present specification, an energy level of the first electrode and/or the auxiliary electrode may be 4 eV or more and 5.5 eV or less.

According to the exemplary embodiment of the present specification, the first electrode may be the anode, a difference in an energy level between the short-circuit preventing layer and the first electrode at the interface of the short-circuit preventing layer and the first electrode is 0.5 eV or more, and a difference in an energy level between the short-circuit preventing layer and the auxiliary electrode at the interface of the short-circuit preventing layer and the auxiliary electrode is 0.5 eV or less.

According to the exemplary embodiment of the present specification, the first electrode may be the cathode, a difference in an energy level between the short-circuit preventing layer and the first electrode at the interface of the short-circuit preventing layer and the first electrode is 0.5 eV or less, and a difference in an energy level between the short-circuit preventing layer and the auxiliary electrode at the interface of the short-circuit preventing layer and the auxiliary electrode is 0.5 eV or more.

According to the exemplary embodiment of the present specification, a difference in an energy level between the auxiliary electrode and the short-circuit preventing layer at an interface of the auxiliary electrode and the short-circuit preventing layer is 0.5 eV or more or 0.5 eV or less.

In the short-circuit preventing layer, resistance during the application of a forward directional voltage may be higher than resistance during the application of a reverse directional voltage by a difference in a work function value between a surface of the short-circuit preventing layer, which is in contact with the auxiliary electrode, and a surface of the short-circuit preventing layer, which is in contact with the first electrode.

Further, when the short-circuit preventing layer is within a work function resistance range, the organic light emitting device may control the amount of current flowing to a short-circuit defection region when a short-circuit defect is generated, thereby enabling the organic light emitting device to normally operate and securing high efficiency during the aging process.

According to the exemplary embodiment of the present specification, the short-circuit preventing layer may include a semiconductor material having electrical conductivity of $10^{-5}$ S/cm or more and $10^{3}$ S/cm or less.

According to the exemplary embodiment of the present specification, the short-circuit preventing layer may include a single layer formed of the semiconductor material.

The single layer may mean that the short-circuit preventing layer includes one layer. Further, the single layer may mean that the short-circuit preventing layer is one unit body including a semiconductor material.

According to the exemplary embodiment of the present specification, the semiconductor material may be a material, in which a difference between hole mobility and electron mobility is two times or more.

According to the exemplary embodiment of the present specification, the interface region of the short-circuit preventing layer, which is in contact with the first electrode and the interface region of the short-circuit preventing layer, which is in contact with the auxiliary electrode may be processed so as to have different energy levels, respectively, to perform the aforementioned function of the short-circuit preventing layer.

The interface region of the short-circuit preventing layer, which is in contact with the first electrode, means a region of the short-circuit preventing layer closer to the first electrode than the auxiliary electrode. The interface region of the short-circuit preventing layer, which is in contact with the auxiliary electrode, means a region of the short-circuit preventing layer closer to the auxiliary electrode than the first electrode.

Particularly, according to the exemplary embodiment of the present specification, a region of the semiconductor material, which is in contact with the first electrode and/or a region of the semiconductor material, which is in contact with the auxiliary electrode may be surface-processed so as to have different energy levels. Particularly, according to the exemplary embodiment of the present specification, plasma processing may be used as a method of the surface treatment. Further, only a surface of any one region may be surface-treated so as to have different energy levels.

Otherwise, according to the exemplary embodiment of the present specification, the region of the short-circuit preventing layer, which is in contact with the first electrode, and the region of the short-circuit preventing layer, which is in contact with the auxiliary electrode, may be doped with different kinds of dopants.

Further, according to the exemplary embodiment of the present specification, the region of the short-circuit preventing layer, which is in contact with the first electrode, and the region of the short-circuit preventing layer, which is in contact with the auxiliary electrode, may be doped with different concentrations.

According to the exemplary embodiment of the present specification, the semiconductor material may include one or more kinds selected from the group consisting of an inorganic material, an organic material, and a polymer.

According to the exemplary embodiment of the present specification, the inorganic material may include one or more kinds selected from the group consisting of a Ti oxide, a Zn oxide, an In oxide, a Sn oxide, a W oxide, a Nb oxide, a Mo oxide, a Mg oxide, a Zr oxide, a Sr oxide, a Yr oxide, a La oxide, a V oxide, an Al oxide, a Y oxide, a Sc oxide, a Sm oxide, a Ga oxide, a SrTi oxide, a Sn fluoride, a Sn oxide, a Zn sulfide, a Cd sulfide, a CdTe, GaAs, and a compound thereof.

According to the exemplary embodiment of the present specification, the organic material may include one or more kinds selected from the group consisting of pentacene, pentacene derivatives, anthracene, anthracene derivatives, thiophene, thiophene derivatives, perylene, perylene derivatives, spiro-MeOTAD(2,2',7'-tetrakis-(N,N-di-p-methoxyphenyl-amine)-9,9' spirobifluorene), tertiary butyl pyridine (TBP), Lithium Bis(Trifluoro methanesulfonyl)Imide (Li-TFSi), and a mixture thereof.

According to the exemplary embodiment of the present specification, the polymer may include one or more kinds selected from the group consisting of P3HT(poly[3-hexyl-thiophene]), MDMO-PPV(poly[2-methoxy-5-(3',7'-dimethyloctyloxyl)]-1,4-phenylene vinylene), MEH-PPV(poly[2-methoxy-5-(2''-ethylhexyloxy)-p-phenylene vinylene]), P3OT(poly(3-octyl thiophene)), P3DT(poly(3-decyl thiophene)), P3DDT(poly(3-dodecyl-11-thiophene), PPV(poly(phenylene vinylene)), TFB(poly(9,9'-dioctylfluorene-co-N-(4-butylphenyl)diphenyl amine), PCPDTBT(Poly[2,1,3-benzothiadiazole-4,7-diyl[4,4-bis(2-ethylhexyl-4Hcyclopenta[2,1-b:3,4-b']dithiophene-2,6-diyl]], Si-PCPDTBT(poly[(4,4'-bis(2-ethylhexyl)dithieno[3,2-b:2', 3'-d]silole)-2,6-diyl-alt-(2,1,3-benzothiadiazole)-4,7-diyl]), PBDTTPD(poly((4,8-diethylhexyloxyl) benzo([1,2-b:4,5-b']dithiophene)-2,6-diyl)-alt-((5-octylthieno[3,4-c]pyrrole-4,6-dione)-1,3-diyl)), PFDTBT(poly[2,7-(9-(2-ethylhexyl)-9-hexyl-fluorene)-alt-5,5-(4',7,-di-2-thienyl-2',1',3'-benzothiadiazole)]), PFO-DBT(poly[2,7-.9,9-(dioctyl-fluorene)-alt-5,5-(4',7'-di-2-.thienyl-2',1',3'-benzothiadiazole)]), PSiFDTBT(poly[(2,7-dioctylsilafluorene)-2,7-diyl-alt-(4,7-bis(2-thienyl)-2,1,3-benzothiadiazole)-5,5'-diyl]), PSBTBT(poly[(4,4'-bis(2-ethylhexyl)dithieno[3,2-b:2',3'-d]silole)-2,6-diyl-alt-(2,1,3-benzothiadiazole)-4,7-diyl]), PCDTBT(Poly[[9-(1-octylnonyl)-9Hcarbazole-2,7-diyl]-2,5-thiophenediyl-2,1,3-benzothiadiazole-4,7-diyl-2,5-thiophenediyl]), PFB(poly(9, 9'-dioctylfluorene-co-bis(N,N'-(4,butylphenyl))bis(N,N'-phenyl-1,4-phenylene)diamine), F8BT(poly(9,9'-dioctylfluorene-cobenzothiadiazole), PEDOT (poly(3,4-ethylenedioxythiophene)), PEDOT:PSS poly(3,4-ethylenedioxythiophene) poly(styrenesulfonate), PTAA (poly(triarylamine)), Poly(4-butylphenyl-diphenyl-amine), and a copolymer thereof.

According to the exemplary embodiment of the present specification, the short-circuit preventing layer may further include a metal and a metal oxide having electrical conductivity of $10^{-2}$ S/cm or more.

According to the exemplary embodiment of the present specification, the metal or the metal oxide may be a metal or a metal oxide having electrical conductivity of 2.7 eV or more and 5.4 eV or less.

According to the exemplary embodiment of the present specification, the metal or the metal oxide may include one or more selected from the group consisting of Pt, Pd, Au, Ag, Cu, Ni, Zn, V, Ru, Rh, Co, Ir, W, Mo, Ti, Zn, In, Sn, Nb, Mg, Zr, Sr, Yr, La, V, Al, Y, Sc, Sm, Ga, and an oxide thereof, and a compound of the oxide.

According to the exemplary embodiment of the present specification, the short-circuit preventing layer may be formed of a first layer including the semiconductor material and a second layer including the metal or the metal oxide, which are in contact with each other. Particularly, the short-circuit preventing layer may be formed of the first layer including a semiconductor material having electrical conductivity of $10^{-5}$ S/cm or more and $10^3$ S/cm or less, and the second layer including a metal or a metal oxide having electrical conductivity of $10^{-2}$ S/cm or more, which are in contact with each other.

By using the short-circuit preventing layer having the two-layer structure, it is possible to adjust an energy level of the region of the short-circuit preventing layer, which is in contact with the first electrode to be different from an energy level of the region of the short-circuit preventing layer, which is in contact with the auxiliary electrode. Through the adjustment, it is possible to adjust resistance of the short-circuit preventing layer during the application of a forward directional voltage to be larger by two times or more than the resistance of the short-circuit preventing layer during the application of a reverse directional voltage.

According to the exemplary embodiment of the present specification, at least a part of the first layer of the short-circuit preventing layer may be provided so as to be in contact with the auxiliary electrode, and at least a part of the second layer of the short-circuit preventing layer may be provided so as to be in contact with the first electrode. In this case, the first electrode may be the anode and the auxiliary electrode may be a metal auxiliary electrode.

According to the exemplary embodiment of the present specification, when the first electrode is the cathode and the auxiliary electrode may be a metal auxiliary electrode, the short-circuit preventing layer may include one layer formed of the semiconductor material. In this case, the metal auxiliary electrode serves as the second layer of the short-circuit preventing layer, so that resistance of the short-circuit preventing layer during the application of a forward directional voltage may be larger than resistance of the short-circuit preventing layer during the application of a reverse directional voltage.

According to the exemplary embodiment of the present specification, the first electrode may include two or more conductive units, which are spaced apart from each other.

According to the exemplary embodiment of the present specification, the respective conductive units may be formed of patterns which are spaced apart from each other. The pattern may have a shape of a closed figure, particularly, a polygon, such as a triangle, a quadrangle, and a hexagon, or a formless shape.

The conductive unit may mean the first electrode. Particularly, the conductive unit may be a minimum unit of the first electrode covered on a substrate. Further, each of the conductive units may be included in each pixel of the organic light emitting device. Further, each of the conductive units may be a region in which light emitted from a light emission layer is emitted to the outside.

The pixel may be one pixel area of the organic light emitting device, and may be a minimum unit of a light emission region.

According to the exemplary embodiment of the present specification, the auxiliary electrode may be disposed to be spaced apart from the two or more conductive units, and each of the two or more conductive units may be electrically connected with the auxiliary electrode through the short-circuit preventing layer.

Particularly, according to the exemplary embodiment of the present specification, when the first electrode includes the two or more conductive units which are spaced apart from each other, the short-circuit preventing layer may be provided so as to be physically in contact with at least a part of each of the conductive units.

When the short-circuit preventing layer is provided so as to be physically in contact with at least the part of each of the conductive units, it is possible to prevent all of the operating currents from flowing to a short-circuit defect portion by the short-circuit preventing layer even if a short-circuit defect is generated in the region including any one conductive unit. That is, the short-circuit preventing layer serves to control the amount of leakage current according to the short-circuit defect to be prevented from limitlessly increasing. Accordingly, regions including the remaining conductive units having no short-circuit defect may normally operate.

The short-circuit preventing layer of the present specification is provided between the first electrode and the auxiliary electrode, and the first electrode and the auxiliary electrode may not be physically in contact with each other. The first electrode, the short-circuit preventing layer, and the auxiliary electrode according to the exemplary embodiment of the present specification may be formed in various designs. A particular example thereof is illustrated in FIG. 2. Particularly, FIG. 2 exemplifies cross-sections of the short-circuit preventing layer provided so as to be in contact with a predetermined region of the first electrode provided on the substrate, and the auxiliary electrode provided so as to be spaced apart from the first electrode. The first electrode of FIG. 2 may be the first electrode which is not patterned. Otherwise, the first electrode of FIG. 2 may mean any one conductive unit in the first electrode patterned with two or more conductive units.

According to the exemplary embodiment of the present specification, the auxiliary electrode may be disposed to be spaced apart from the two or more conductive units, and the auxiliary electrode may be provided in a mesh structure surrounding the one or more conductive units.

There may occur a phenomenon that even though the organic light emitting device having a short-circuit defect normally operates by the short-circuit preventing layer, light emission intensity of a surrounding region of the short-circuit defect region is relatively decreased by a voltage drop (IR drop) phenomenon to become dark. When the auxiliary electrode is provided in a mesh structure, the auxiliary electrode may enable a leakage current to effectively flow to the surrounding region of the short-circuit defect region despite the IR drop due to a short-circuit defect. Accordingly, when the auxiliary electrode is provided in a mesh structure, it is possible to relieve a phenomenon that the surrounding region of the short-circuit defect region becomes dark.

According to the exemplary embodiment of the present specification, resistance between the adjacent conductive units may be 600Ω or more and 6 MΩ or less.

The term "adjacent" may mean that the conductive units are positioned closest among the two or more conductive units.

According to the exemplary embodiment of the present specification, the resistance of each of the conductive units and the auxiliary electrode may be 300Ω or more and 3 MΩ or less during the application of a forward directional voltage.

According to the exemplary embodiment of the present specification, the resistance of each of the conductive units and the auxiliary electrode may be 150Ω or more and 1.5 MΩ or less during the application of a reverse directional voltage.

According to the exemplary embodiment of the present specification, an increment of a driving voltage of the organic light emitting device by the short-circuit preventing layer may be 1% or more and 5% or less compared to a driving voltage in a case where the short-circuit preventing is not provided.

According to the exemplary embodiment of the present specification, each of the conductive units may be controlled to have the amount of current of 10 mA or less during the application of a forward directional voltage.

It is possible to control the amount of current flowing to each of the conductive units by the short-circuit preventing layer. Particularly, the short-circuit preventing layer may control the amount of leakage current flowing to a short-circuit defect region generated in a region of any one conductive unit to be 10 mA or less.

Further, the short-circuit preventing layer may make an instantaneous current of 20 mA or more flow during the application of a reverse directional voltage for the aging process.

According to the exemplary embodiment of the present specification, when an operation voltage of the organic light emitting device is 3 V to 15 V, and an increment of the driving voltage by the short-circuit preventing layer is 1% to 5%, the amount of leakage current may be the amount of leakage current generated in one region of the organic light emitting device.

According to the exemplary embodiment of the present specification, the first electrode may be a transparent electrode.

When the first electrode is a transparent electrode, the first electrode may be a conductive oxide, such as an indium tin oxide (ITO) or an indium zinc oxide (IZO). Further, the first electrode may also be a semi-transparent electrode. When the first electrode is the semi-transparent electrode, the first electrode may be formed of a semi-transparent metal, such as Ag, Au, Mg, Ca, or an alloy thereof. When the semi-transparent metal is used as the first electrode, the organic light emitting device may have a microcavity structure.

According to the exemplary embodiment of the present specification, the auxiliary electrode may be formed of a metal material. That is, the auxiliary electrode may be a metal auxiliary electrode.

The auxiliary electrode may generally use all of the metals. Particularly, the auxiliary electrode may include aluminum, copper, and/or silver having excellent conductivity. When the auxiliary electrode uses aluminum for attachment force with the transparent electrode and stability in a photo process, a molybdenum/aluminum/molybdenum layer may also be used.

According to the exemplary embodiment of the present specification, the organic light emitting device may further include a substrate provided on a surface opposite to a surface on which the organic material layer of the first electrode is provided.

A substrate having excellent transparency, surface flatness, treatment easiness, and waterproofing property may be used as the substrate. Particularly, a glass substrate, a thin glass substrate, or a transparent plastic substrate may be used as the substrate. A film of polyethylene terephthalate (PET), polyethylene naphthalate (PEN), polyether ether ketone (PEEK), and polyimide (PI) may be included in the plastic substrate in a form of a single layer or a multilayer. Further, the substrate itself may include a light scattering function. However, the substrate is not limited thereto, and a substrate generally used in the organic light emitting device may be used.

According to the exemplary embodiment of the present specification, the first electrode may be the anode and the second electrode may be the cathode. Further, the first electrode may be the cathode and the second electrode may be the anode.

The anode may be typically formed of a material having a high work function so as to facilitate the injection of holes into the organic material layer. Particular examples of the anode material that may be used in the present invention include metal, such as vanadium, chrome, copper, zinc, and gold or an alloy thereof; a metal oxide, such as a zinc oxide, an indium oxide, an indium tin oxide (ITO), and an indium zinc oxide (IZO); a combination of a metal and an oxide, such as $ZnO:Al$ or $SnO_2:Sb$; and a conductive polymer, such as poly(3-methylthiophene), poly[3,4-(ethylene-1,2-dioxy) thiophene](PEDOT), polypyrole, and polyaniline, but the anode material is not limited thereto.

The anode material is not limited only to the anode, and may be used as a material of the cathode.

The cathode may be typically formed of a material having a low work function so as to facilitate the injection of electrons into the organic material layer. Particular examples of the cathode material include a metal, such as magnesium, calcium, sodium, potassium, titanium, indium, yttrium, lithium, gadolinium, aluminum, silver, tin and lead, or an alloy thereof; a multi-layer structured material, such as LiF/Al or $LiO_2$/Al, but the cathode material is not limited thereto.

The cathode material is not limited only to the cathode, and may be used as a material of the anode.

According to the exemplary embodiment of the present specification, the organic material layer includes one or more light emission layers, and may further include one kind or two or more kinds selected from the group consisting of a hole injection layer, a hole transporting layer, a hole blocking layer, a charge generating layer, an electron blocking layer, an electron transporting layer, and an electron injection layer.

The charge generating layer means a layer in which holes and electrons are generated when a voltage is applied thereto.

A material of the hole transporting layer according to the present specification is a material that receives the holes from the anode or the hole injection layer and transfers the received holes to the light emission layer, and a material having excellent mobility for the holes is appropriate. Particular examples of the material of the hole transporting layer include an arylamine-based organic material, a conductive polymer, and a block copolymer having a conjugated portion and a non-conjugated portion together, but the material of the hole transporting layer is not limited thereto.

A material of the light emission layer according to the present specification is a material that is capable of emitting light at a range of visible rays by receiving the holes and the electrons from the hole transporting layer and the electron transporting layer, respectively, and combining the holes and electrons, and a material having excellent photon efficiency for fluorescence or phosphorescence is preferable. Particular examples of the material of the light emission layer include 8-hydroxy-quinoline-aluminum complex ($Alq_3$); carbazole-based compounds; dimerized styryl compounds; BAlq; 10-hydroxybenzoquinoline-metal compounds; benzoxazole-based, benzthiazole-based and benzimidazole-based compounds; poly(p-phenylenevinylene)(PPV)-based polymers; spiro compounds; and polyfluorene, and rubrene, but the material of the light emission layer is limited thereto.

A material of the electron transporting layer according to the present specification is a material that may well receive the electrons from the cathode well and transfer the received electrons to the light emission layer, and a material having excellent mobility for electrons is appropriate. Particular examples of the material of the electron transporting layer include Al complexes of 8-hydroxyquinoline; complexes including $Alq_3$; organic radical compounds; and hydroxyflavone-metal complexes, but the material of the electron transporting layer is not limited thereto.

According to the exemplary embodiment of the present specification, the organic light emitting device may be sealed by an encapsulation layer.

The encapsulation layer may be formed of a transparent resin layer. The encapsulation layer may serve to protect the organic light emitting device from oxygen or contaminant materials, and may be formed of a transparent material so as not to disturb light emission of the organic light emitting device. The term "transparent" may mean that 60% or more of light passes. Particularly, the term "transparent" may mean that 75% or more of light passes.

According to the exemplary embodiment of the present specification, the organic light emitting device may emit white light having a color temperature of 2,000 K or more and 12,000 K or less.

FIG. 1 is a plan view and a cross-sectional view of one conductive unit in an organic light emitting device according to an exemplary embodiment of the present specification. Particularly, FIG. 1 illustrates one conductive unit of a first electrode 2 provided on a substrate 1. Further, FIG. 1 illustrates an organic light emitting device in which a short-circuit preventing layer may include a first layer 3-1 and a second layer 3-2, and the first layer 3-1 formed of a semiconductor material is in contact with an auxiliary electrode 4, and the second layer 3-2 formed of a metal or a metal oxide is in contact with the first electrode 2.

According to the exemplary embodiment of the present specification, the organic light emitting device may include a light scattering layer.

According to the exemplary embodiment of the present specification, the organic light emitting device may further include a substrate provided on a surface opposite to a surface on which an organic material layer of the first electrode is provided, and further include an internal light scattering layer provided between the substrate and the first electrode.

According to the exemplary embodiment of the present specification, the light scattering layer may include a planarizing layer. According to the exemplary embodiment of the present specification, the planarizing layer may be provided between the first electrode and the light scattering layer.

According to the exemplary embodiment of the present specification, the organic light emitting device may further include a substrate provided on a surface opposite to a surface on which an organic material layer of the first electrode is provided, and further include a light scattering layer on a surface of the substrate opposite to a surface on which the first electrode of the substrate is provided.

According to the exemplary embodiment of the present specification, as long as the light scattering layer has a structure capable of inducing light scattering and improving efficiency of light scattering of the organic light emitting device, the light scattering layer is not specially limited. Particularly, according to the exemplary embodiment of the present specification, the light scattering layer may have a structure in which scattering particles are scattered within a binder, a film having concave-convex portions, and/or a film having haziness.

According to the exemplary embodiment of the present specification, the light scattering layer may be directly formed on the substrate by a method, such as spin coating, bar coating, and slit coating, or may be prepared in a film type and attached on the substrate.

According to the exemplary embodiment of the present specification, the organic light emitting device may be a flexible organic light emitting device. In this case, the substrate may include a flexible material. Particularly, the substrate may be a bendable thin film-type glass or plastic substrate, or a film-type substrate.

A material of the plastic substrate is not specially limited, but may generally include a film of polyethylene terephthalate (PET), polyethylene naphthalate (PEN), polyether ether ketone (PEEK), polyimide (PI) and the like in a form of a single layer or a multilayer.

The present specification provides a display device including the organic light emitting device. In the display device, the organic light emitting device may serve as a pixel or a backlight. Configurations known in the art may be applied as other configurations of the display device.

The present specification provides a lighting device including the organic light emitting device. The organic light emitting device in the lighting device serves as a light emitting unit. Configurations known in the art may be applied as other configurations necessary for the lighting device.

Hereinafter, the present specification will be described in detail with reference to Examples for the detailed description. However, the Examples according to the present specification may be modified in various forms, and the scope of the present specification is not interpreted as being limited to the Examples described in detail below. The Examples of the present specification are provided for more completely explaining the present specification to those skilled in the art.

[Example 1]—Manufacture a Short-Circuit Preventing Layer Having Forward-Directional and Reverse-Directional Asymmetric Resistance An anode was formed on a glass substrate as a first electrode, and Al was deposited with a thickness of 500 nm by using a vacuum thermal deposition method as an auxiliary electrode so as to be spaced apart from the first electrode. When the auxiliary electrode was formed, a shape of the auxiliary electrode was formed by attaching a shadow mask formed of an inbar material having a thickness of 0.05 mm to the glass substrate, and then Al was deposited.

Next, the first layer, a short-circuit preventing layer, and the auxiliary electrode were formed on the substrate by forming a first layer of a short-circuit preventing layer by using ZnO, and forming a second layer of the short-circuit preventing layer by using Cu. When the first layer of the short-circuit preventing layer is formed, a ZnO film was deposited on a glass substrate, on which the auxiliary electrode was formed, with a thickness of 100 nm, and a pattern was formed by using the shadow mask. In this case, vacuum was 1 mTorr, and a ZnO target was sputtered by using Ar plasma having RF power of 200 W. When the second layer of the short-circuit preventing layer was formed, Cu was deposited on the first layer of the short-circuit preventing layer with a thickness of 100 nm by using a vacuum thermal deposition method.

Since contact resistance between Cu positioned at the topmost part and the first electrode is ignorable, it may be assumed that potentials of the Cu layer and the first electrode are the same as each other. Based on this, a voltage-current characteristic between the auxiliary electrode (Al) and Cu was measured.

[Comparative Example 1]—Manufacture a Short-Circuit Preventing Layer Having Same Forward-Directional and Reverse-Directional Resistance (Asymmetric Resistance)

With the exception that a second layer of a short-circuit preventing layer was formed of Al, a first electrode, the short-circuit preventing layer, and the auxiliary electrode were formed on a substrate by the same method as that of Example 1.

Since contact resistance between Al positioned at the topmost part and the first electrode may be disregarded, it may be assumed that potentials of the Al layer and the first electrode are the same as each other. Based on this, a voltage-current characteristic between the auxiliary electrode (Al) and Al was measured.

FIG. 3 illustrates a voltage-current characteristic between the auxiliary electrode and the second layer of the short-circuit preventing layer according to Example 1 and Comparative Example 1.

FIG. 4 illustrates a resistance difference between application of a forward directional voltage and application of a reverse directional voltage after the measurement of the voltage-current characteristic of FIG. 3.

As can be seen from the results of FIGS. 3 and 4, it can be seen that in the short-circuit preventing layer according to the exemplary embodiment of the present specification, a resistance value when a forward directional voltage is applied is larger by two times or more than a resistance value when a reverse directional voltage is applied.

Particularly, it can be seen that the organic light emitting device according to the exemplary embodiment may prevent a current from excessively flowing by the short-circuit preventing layer according to an increase in a voltage during the application of a constant voltage. Further, in the organic light emitting device according to the exemplary embodiment, when a size of a reverse directional voltage is increased during application of the reverse directional voltage for a post-treatment process, a reverse-directional current is increased in proportion to the increase of the reverse directional voltage, thereby minimizing deterioration of efficiency of the post-treatment process.

By contrast, it can be seen that the organic light emitting device according to the Comparative Example includes a short-circuit preventing layer of which resistance during application of a forward directional voltage and resistance during application of a reverse directional voltage are uniformly low, so that it is impossible to control a flow of an excessive current by the short-circuit preventing layer according to an increase in a voltage during application of a constant voltage.

Further, it can be expected that in the organic light emitting device including a short-circuit preventing layer of which resistance during application of a forward directional voltage and resistance during application of a reverse directional voltage are uniformly high, efficiency of a post-treatment process may deteriorate due to high resistance of the short-circuit preventing layer during application of a reverse directional voltage for the post-treatment process.

EXPLANATION OF REFERENCE NUMERALS AND SYMBOLS

1: Substrate
2: First electrode
3: Short-circuit preventing layer
3-1: First layer of short-circuit preventing layer
3-2: Second layer of short-circuit preventing layer
4: Auxiliary electrode

The invention claimed is:
1. An organic light emitting device, comprising:
a first electrode;
a second electrode provided so as to be opposite to the first electrode;
one or more organic material layers provided between the first electrode and the second electrode;
an auxiliary electrode of the first electrode; and
a short-circuit preventing layer provided between the first electrode and the auxiliary electrode,
wherein the first electrode and the auxiliary electrode are provided so as to be spaced apart from each other,
the short-circuit preventing layer is in contact with at least a part of the first electrode and at least a part of the auxiliary electrode, and
any one of a difference in an energy level of the short-circuit preventing layer and the first electrode at an interface of the short-circuit preventing layer and the first electrode and a difference in an energy level of the short-circuit preventing layer and the auxiliary electrode at an interface of the short-circuit preventing layer and the auxiliary electrode is 0.5 eV or more, and the other is 0.5 eV or less.

2. The organic light emitting device of claim 1, wherein an energy level of the first electrode or the auxiliary electrode is 4 eV or more and 5.5 eV or less.

3. The organic light emitting device of claim 1, wherein the first electrode is an anode;
a difference in an energy level between the short-circuit preventing layer and the first electrode at the interface of the short-circuit preventing layer and the first electrode is 0.5 eV or more, and
a difference in an energy level between the short-circuit preventing layer and the auxiliary electrode at the interface of the short-circuit preventing layer and the auxiliary electrode is 0.5 eV or less.

4. The organic light emitting device of claim 1, wherein the first electrode is a cathode, and
a difference in an energy level between the short-circuit preventing layer and the first electrode at the interface of the short-circuit preventing layer and the first electrode is 0.5 eV or less, and a difference in an energy level between the short-circuit preventing layer and the auxiliary electrode at the interface of the short-circuit preventing layer and the auxiliary electrode is 0.5 eV or more.

5. An organic light emitting device, comprising:
a first electrode;
a second electrode provided so as to be opposite to the first electrode;
one or more organic material layers provided between the first electrode and the second electrode;
an auxiliary electrode of the first electrode; and
a short-circuit preventing layer provided between the first electrode and the auxiliary electrode,
wherein the first electrode and the auxiliary electrode are provided so as to be spaced apart from each other,
the short-circuit preventing layer is in contact with at least a part of the first electrode and at least a part of the auxiliary electrode, and
resistance of the short-circuit preventing layer when a forward directional voltage is applied is larger than resistance of the short-circuit preventing layer when a reverse directional voltage is applied.

6. The organic light emitting device of claim 5, wherein the resistance of the short-circuit preventing layer when the forward directional voltage is applied is larger by two times or more than the resistance of the short-circuit preventing layer when the reverse directional voltage is applied.

7. The organic light emitting device of claim 5, wherein the resistance of the short-circuit preventing layer when the forward directional voltage is applied is larger by five times or more than the resistance of the short-circuit preventing layer when the reverse directional voltage is applied.

8. The organic light emitting device of claim 5, wherein the resistance of the short-circuit preventing layer when the forward directional voltage is applied is 300Ω or more and 3 MΩ or less.

9. The organic light emitting device of claim 5, wherein the resistance of the short-circuit preventing layer when the reverse directional voltage is applied is 60Ω or more and 1.5 MΩ or less.

10. The organic light emitting device of claim 5, wherein the short-circuit preventing layer includes a semiconductor material having electrical conductivity of $10^{-5}$ S/cm or more and $10^{3}$ S/cm or less.

11. The organic light emitting device of claim 10, wherein the semiconductor material includes one or more kinds selected from the group consisting of an inorganic material, an organic material, and a polymer.

12. The organic light emitting device of claim 10, wherein the short-circuit preventing layer further includes a metal and a metal oxide having electrical conductivity of $10^{-2}$ S/cm or more.

13. The organic light emitting device of claim 5, wherein the short-circuit preventing layer electrically connects the first electrode and the auxiliary electrode.

14. The organic light emitting device of claim 5, wherein the short-circuit preventing layer is provided in a single layer including a semiconductor material having electrical conductivity of $10^{-5}$ S/cm or more and $10^{3}$ S/cm or less.

15. The organic light emitting device of claim 14, wherein the semiconductor material is a material, in which a difference between hole mobility and electron mobility is two times or more.

16. The organic light emitting device of claim 14, wherein a region of the short-circuit preventing layer, which is in contact with the first electrode, and a region of the short-circuit preventing layer, which is in contact with the auxiliary electrode, are doped with different kinds of dopants.

17. The organic light emitting device of claim 14, wherein a region of the short-circuit preventing layer, which is in contact with the first electrode, and a region of the short-circuit preventing layer, which is in contact with the auxiliary electrode, are doped with different concentrations.

18. The organic light emitting device of claim 5, wherein the short-circuit preventing layer is formed of a first layer including a semiconductor material having electrical conductivity of $10^{-5}$ S/cm or more and $10^3$ S/cm or less, and a second layer including a metal or a metal oxide having electrical conductivity of $10^{-2}$ S/cm or more, which are in contact with each other.

19. The organic light emitting device of claim 18, wherein at least a part of the first layer of the short-circuit preventing layer is provided so as to be in contact with the auxiliary electrode, and at least a part of the second layer of the short-circuit preventing layer is provided so as to be in contact with the first electrode.

20. The organic light emitting device of claim 5, wherein the first electrode includes two or more conductive units provided so as to be spaced apart from each other.

21. The organic light emitting device of claim 20, wherein the auxiliary electrode is disposed to be spaced apart from the two or more conductive units, and each of the two or more conductive units is electrically connected with the auxiliary electrode through the short-circuit preventing layer.

22. The organic light emitting device of claim 20, wherein the auxiliary electrode is disposed to be spaced apart from the two or more conductive units, and the auxiliary electrode is provided in a mesh structure surrounding the one or more conductive units.

23. The organic light emitting device of claim 20, wherein resistance between the adjacent conductive units is 600Ω or more and 6 MΩ or less.

24. The organic light emitting device of claim 20, wherein resistance of each of the conductive units and the auxiliary electrode is 300Ω or more and 3 MΩ or less during the application of the forward directional voltage.

25. The organic light emitting device of claim 20, wherein resistance of each of the conductive units and the auxiliary electrode is 150Ω or more and 1.5 MΩ or less during the application of the reverse directional voltage.

26. The organic light emitting device of claim 20, wherein each of the conductive units is controlled to have the amount of current of 10 mA or less during the application of the forward directional voltage.

27. The organic light emitting device of claim 5, wherein the auxiliary electrode is a metal auxiliary electrode.

28. The organic light emitting device of claim 5, wherein the organic material layer includes one or more light emission layers, and further includes one kind or two or more kinds selected from the group consisting of a hole injection layer, a hole transporting layer, a hole blocking layer, a charge generating layer, an electron blocking layer, an electron transporting layer, and an electron injection layer.

29. The organic light emitting device of claim 5, further comprising:

a substrate provided on a surface opposite to a surface on which an organic material layer of the first electrode is provided; and an internal light scattering layer provided between the substrate and the first electrode.

30. The organic light emitting device of claim 29, wherein the light scattering layer includes a planarizing layer.

31. The organic light emitting device of claim 5, further comprising:

a substrate provided on a surface opposite to a surface on which an organic material layer of the first electrode is provided; and a light scattering layer on a surface opposite to a surface on which the first electrode of the substrate is provided.

32. The organic light emitting device of claim 5, wherein the organic light emitting device is a flexible organic light emitting device.

33. A display device including the organic light emitting device according to claim 5.

34. A lighting device including the organic light emitting device according to claim 5.

* * * * *